United States Patent [19]

Nakayama et al.

[11] Patent Number: 5,436,424
[45] Date of Patent: Jul. 25, 1995

[54] PLASMA GENERATING METHOD AND APPARATUS FOR GENERATING ROTATING ELECTRONS IN THE PLASMA

[75] Inventors: Ichiro Nakayama, Kadoma; Noboru Nomura, Kyoto; Tokuhiko Tamaki, Sakai; Mitsuhiro Okuni, Higashiosaka; Masafumi Kubota, Osaka, all of Japan

[73] Assignee: Matsushita Electric Industrial Co., Ltd., Osaka, Japan

[21] Appl. No.: 80,824

[22] Filed: Jun. 24, 1993

[30] Foreign Application Priority Data

Jun. 25, 1992 [JP] Japan .................................. 4-167177

[51] Int. Cl.⁶ .............................................. B23K 10/00
[52] U.S. Cl. ............................ 219/121.43; 219/121.44; 219/121.47; 156/345; 204/298.34
[58] Field of Search .................. 219/121.43, 121.44, 219/121.47; 156/643, 646, 345; 204/298.08, 298.16, 298.17, 298.35, 298.38, 298.34; 427/34

[56] References Cited

U.S. PATENT DOCUMENTS

| | | | |
|---|---|---|---|
| 4,491,496 | 1/1985 | Laporte et al. | 156/345 |
| 4,871,421 | 10/1989 | Ogle et al. | 156/643 |
| 5,110,438 | 5/1992 | Ohmi et al. | 204/298.34 |
| 5,116,482 | 5/1992 | Setoyama et al. | 204/298.08 |
| 5,150,375 | 9/1992 | Tabata et al. | 372/98 |
| 5,203,958 | 4/1993 | Arai et al. | 156/643 |
| 5,228,939 | 7/1993 | Chu | 156/345 |
| 5,272,417 | 12/1993 | Ohmi | 204/298.32 |

FOREIGN PATENT DOCUMENTS

| | | |
|---|---|---|
| 60-153129 | 8/1985 | Japan . |
| 62-44576 | 2/1987 | Japan . |
| 5-51172 | 7/1993 | Japan . |

*Primary Examiner*—Mark H. Paschall
*Attorney, Agent, or Firm*—Wenderoth, Lind & Ponack

[57] ABSTRACT

A plasma generating apparatus includes a vacuum chamber having an insulated inner surface, more than two electrodes arranged on the insulated inner surface of the vacuum chamber, a high frequency applying device for applying high frequencies having different phases in order of positions of the electrodes, and a holder on which an object to be processed is placed. In the apparatus, a magnetic field is produced under plural alternating electric fields, so that electrons in a plasma generating portion are rotated to generate high density plasma under a high vacuum when the high frequencies are applied to the electrodes to generate the plasma and a specified process such as etching, CVD, or doping is carried on the object by reaction products generated at the portion.

6 Claims, 3 Drawing Sheets

PLASMA GENERATING METHOD AND APPARATUS FOR GENERATING ROTATING ELECTRONS IN THE PLASMA

BACKGROUND OF THE INVENTION

The present invention relates to a plasma generating method and apparatus utilized in a process for manufacturing a semiconductor or a thin film circuit.

Recently, fine processes using a plasma have become popular in processes for manufacturing semiconductors or thin film circuits. More particularly, in dry etching, CVD, a doping processes, and gas suitable for a desired purpose is introduced into a vacuum chamber which has electrodes, and a high frequency electric power is applied to the electrodes to relatively simply carry out those processes. Thus, such fine processes using plasma are used in many processes.

For example, in the dry etching process, it is indispensable to make patterns fine, prevent ion scattering, and improve the directional properties of ions. Therefore, it is effective to increase the degree of vacuum and then to increase the mean free paths of the ions. Then, etching is effected under a high degree of vacuum.

Generally, as the degree of vacuum increases, the generation of a high frequency becomes more difficult. To prevent such a disadvantage, a method in which a magnetic field is applied to a plasma chamber to make the discharge easy, that is, a magnetron discharge or ECR (electron cyclotron resonance) discharge has been developed.

FIG. 3 is a schematic diagram showing a conventional dry etching apparatus using a magnetron discharge. In a vacuum chamber 29, a reactive gas is introduced through a gas controller 30 to control the pressure to become suitable by an exhaust system 31. An anode 32 is provided on the upper portion of the chamber 29 and a sample table 33 as a cathode is provided on the lower portion thereof. The table 33 is connected to an RF source 35 through an impedance matching circuit 34 to generate a high frequency discharge between the holder 33 and the anode 32. In the chamber 29, a magnetic field is applied thereto by an alternative electromagnet 36 provided on the side surface thereof to make the discharge easy in a high degree of vacuum. The applied magnetic field allows the cycloid movement of electrons to increase the ionization rate.

However, it is difficult to treat the magnetron discharge or ECR discharge because of uneven plasma density. A sample to be processed is subjected to any damage in such a discharge. For example, in a conventional magnetron dry etching apparatus, there is local plasma bias in accordance with the magnetic field to produce the local potential. Then, when the apparatus is used for manufacturing MOS LSIs, the destruction of gate oxide films is caused. Similarly, in the conventional ECR etching apparatus, the magnetic field has distribution in a radial direction of the chamber to cause uneven etching and to produce a local potential, on the basis of locally uneven plasma degrees.

SUMMARY OF THE INVENTION

Accordingly, an object of the present invention is to provide a method and an apparatus for generating a uniform high density plasma in a high degree of vacuum.

In accomplishing these and other aspects, according to one aspect of the present invention, there is provided a method for generating a plasma by applying to more than two electrodes arranged on an insulated surface of a vacuum chamber high frequencies having different phases in order of positions of the electrodes, in which electrons are rotated in a portion of the chamber where the plasma is generated when the high frequencies are applied to the electrodes to generate the plasma.

According to another aspect of the present invention, there is provided a plasma generating apparatus comprising:
  a vacuum chamber having an insulated inner surface;
  more than two electrodes arranged on the insulated inner surface of the vacuum chamber;
  a high frequency applying device for applying high frequencies having different phases in order of positions of the electrodes; and
  a holder on which an object to be processed is placed;
  wherein electrons, in a portion of the chamber where the plasma is generated, are rotated when the high frequencies are applied to the electrodes to generate the plasma and a specified process is carried out onto the object by reaction products generated at the portion.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
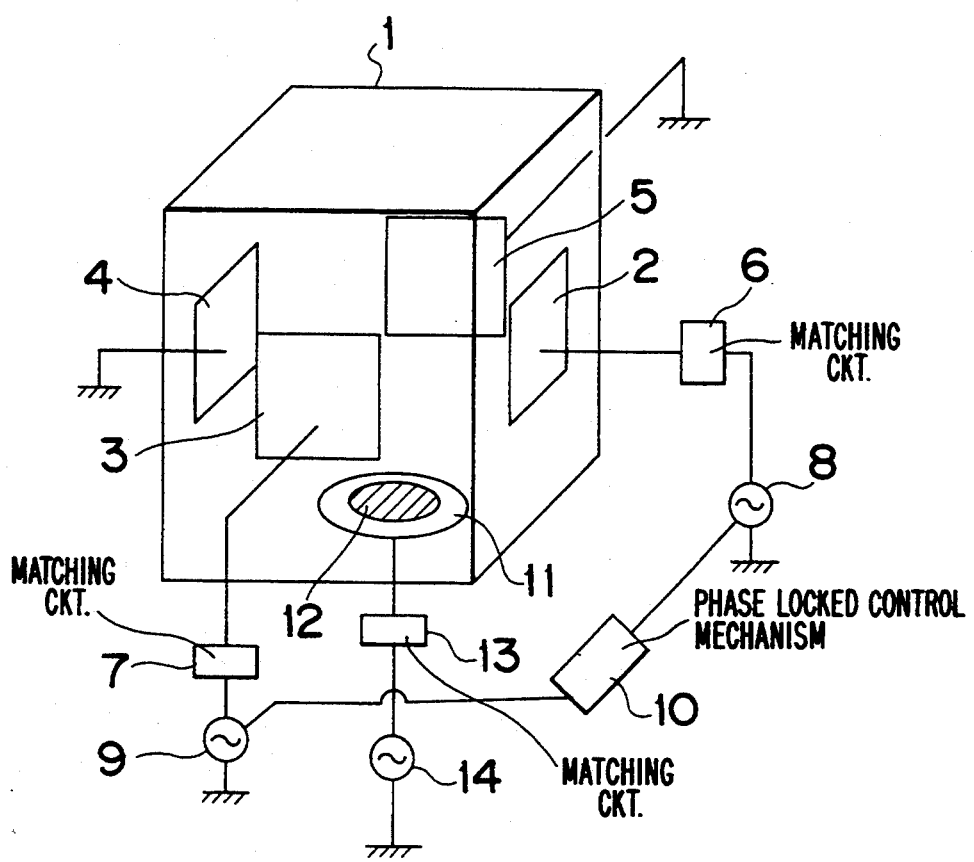
FIG. 1 is a schematic diagram showing the construction of a plasma generating apparatus for carrying out a plasma generating method, according to first, second, and third embodiments of the present invention.

Before the description of the present invention proceeds, it is to be noted that like parts are designated by like reference numerals throughout the accompanying drawings.

A first embodiment of the present invention which can be applied to an etching process is described below with reference to FIG. 1.

A plasma generating apparatus for carrying out a plasma generating method, according to the first embodiment is shown in FIG. 1. In FIG. 1, reference numeral 1 denotes a chamber made of an insulating material such as quartz; elements 2 and 3 are electrodes to which a high frequency electric power is applied through respective matching circuits 6 and 7; and elements 4 and 5 are ground electrodes which respectively oppose the electrodes 2 and 3, respectively. The high frequency electric power which are the same as each other are applied to the electrodes 2 and 3 from high frequency power sources 8 and 9, respectively. The phase of the high frequency electric power applied to the electrode 2 is shifted by approximately 90° from that of the high frequency electric power applied to the electrode 3 by a known phase-locked control mechanism 10.

According to the plasma generating apparatus, for example, an etching gas such as $SF_6$ of 5 sccm is introduced in the chamber 1 to control the pressure therein to keep 1 Pa. In this condition, 100 w of electric power is applied to each of the electrodes 2 and 3 from the power sources 8 and 9 at 50 MHz. An object 12 to be treated is placed on a sample table 11. The object 12 is formed so that polysilicon is deposited on the surface thereof and then a resist is patterned through a photolithographic process. A 100 w of electric power is applied on the sample table 11 through a matching circuit 13 by a power source 14 at 800 KHz.

Then, the etching rate of polysilicon is 4000–5000 Å/min, the uniformity is ±5% or less, which show excellent etching characteristics. There is little side etching in the etching configuration as compared with the conventional dry etching apparatus. There is little local bias of the plasma, which causes little damage to devices such as the destruction of gate oxide films in MOS LSIs.

Next, a second embodiment of the present invention which can be applied to a CVD process is described below with reference to FIG. 1. A plasma generating apparatus and a plasma generating method of the second embodiment is the same as those of the first embodiment except for the following operation.

According to the plasma generating apparatus, an etching gas such as $SiH_4$ ($N_2$ 20% dilution), and $NH_3$ gas of 15 sccm and $N_2$ gas of 34 sccm are introduced in the chamber 1 to control the pressure therein to keep 1 Pa. In this condition, 200 w of electric power is applied to each of the electrodes 2 and 3 from the power sources 8 and 9 at 50 MHz. The object 12 to be treated such as a silicon substrate is placed on the sample table 11. The sample table 11 has a constant temperature of 300° C. 50 w of electric power is applied to the sample table 11 through the matching circuit 13 by the power source of 800 KHz.

Then, the speed for forming a plasma silicon nitride thin film is 800 Å/min, the uniformity is ±3% or less, which show excellent etching character.

Next, a third embodiment of the present invention which can be applied to a doping process is described below with respect to FIG. 1. The plasma generating apparatus and method of the third embodiment is the same as those of the first embodiment except for the following operation.

According to the apparatus, a doping gas such as $B_2H_6$ of 5 sccm is introduced in the chamber 1 to control the pressure therein to keep 0.3 Pa. In this condition, 100 w of electric power is applied to each of the electrodes 2 and 3 from the power sources 8 and 9 at 50 MHz. The object 12 to be treated such as a silicon substrate is placed on the sample table 11. 500 w of electric power is applied onto the sample table 11 through the matching circuit 13 by the power source 14 of 800 KHz.

Then, after discharging for one minute, the boron density fin the vicinity of the surface of the silicon substrate 12 is analyzed by SIMS (secondary ion mass spectroscopy), which indicate the doping density to be $2 \times 10^{21}$ in number, thus showing excellent doping results.

Figure 2:
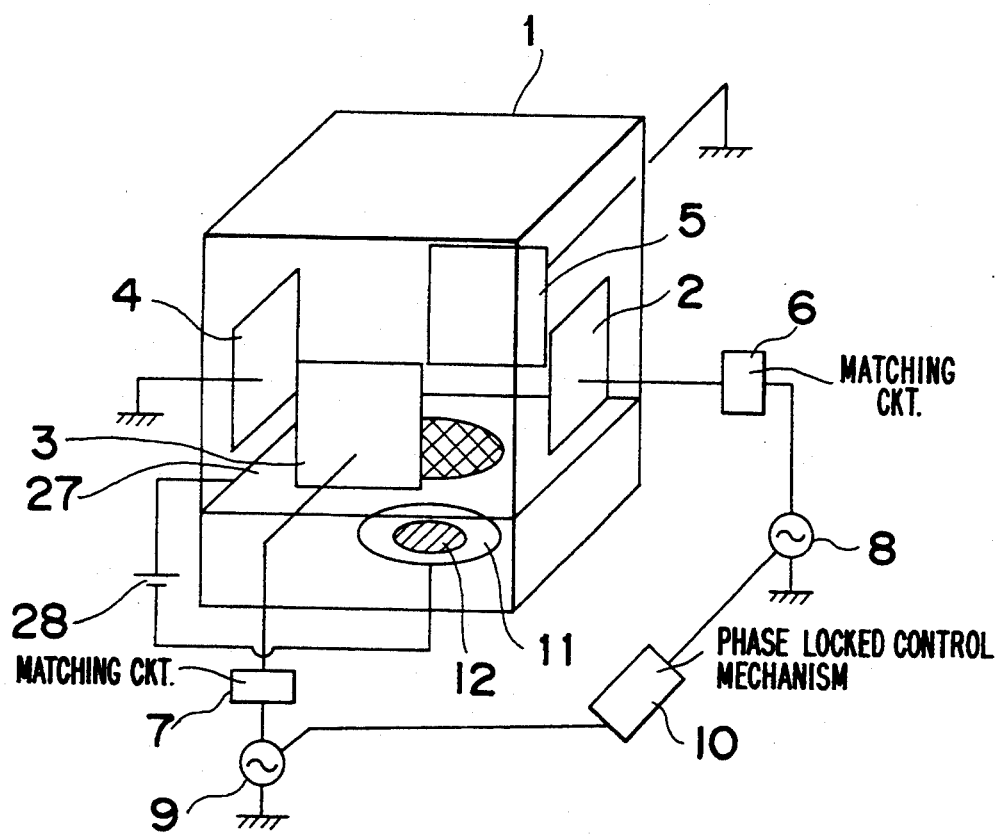
FIG. 2 is a schematic diagram showing the construction of a plasma generating apparatus for carrying out a plasma generating method, according to a fourth embodiment of the present invention.
Figure 3:
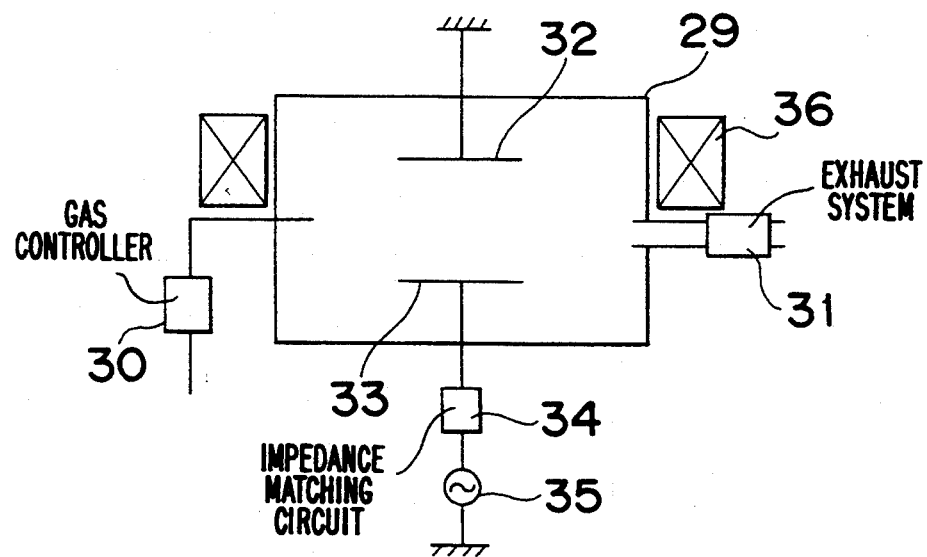
FIG. 3 is a schematic diagram showing a conventional reactive ion-etching apparatus using a magnetron discharge.

Next, a fourth embodiment of the present invention which can be applied to a doping process is described below with respect to FIG. 2. The plasma generating apparatus and method of the fourth embodiment is the same as the apparatus shown in FIG. 1 except for a grid 27 and a DC power source 28 and the following operation.

According to the apparatus, a doping gas such as $B_2H_6$ of 5 sccm is introduced in the chamber 1 to control the pressure therein to keep 0.3 Pa. In this condition, 100 w of electric power is applied to each of the electrodes 2 and 3 from the power sources 8 and 9 at 50 MHz. The object 12 to be treated such as a silicon substrate is placed on the sample table 11. There is a potential of 2 KV between the sample table 11 and the grid 27 by the DC power source 28.

Then, after discharging for two minutes, the boron density in the vicinity of the surface of the silicon substrate 12 is analyzed by SIMS, which indicate the doping density to be $5 \times 10^{21}$ in number, which shows excellent doping results.

According to the embodiments, more than three electrodes, that is, the four electrodes 2,3,4,5 are arranged in the chamber 1 on the insulating material, and the high frequencies which are different from each other in phase in order of the positions of the electrodes are applied to the electrodes to generate a plasma to rotate electrons in the plasma generating portion. That is, the application of the high frequencies to the electrodes causes a magnetic field which allows the oscillation and rotation of electrons. Thus, under even a high vacuum, a high ionization efficiency can be obtained to make the discharge easy. As compared with the conventional magnetron discharge or ECR discharge, the apparatus according to each embodiment can produce the uniform electric field to obtain a plasma with excellent uniformity and make it easy to design a large scale apparatus. There is little local bias of the plasma, which causes little damage to an object to be processed. The insulating material of the chamber prevents the electrons from flowing out of the chamber. In the embodiments, preferably, the surface of the holder where the object is placed is substantially the same as the electrodes to increase the processing rate for etching, CVD, or doping because the electrodes are located at portions where the plasma density is high. Furthermore, in order to obtain the same effects as above, the electrodes may be located on the same circle.

Although the present invention is described using the etching, CVD, and doping apparatuses in the embodiments, the present invention can be applied to a sputtering, an ion source for an ion implantation device, and any apparatus which requires a high vacuum plasma. And, though the embodiments are described in the case where the constant phase difference of the high frequency is 90 degree, the phase difference may vary like a time function. Although the description is directed to four electrodes, the number of electrodes may be N (N is any integer more than 2) as long as the phase difference is 360/N, thus obtaining the same effects as above. The high frequencies may be different from each other in phase by 120° in order of the positions of the electrodes, for example. Instead of the chamber comprised of the insulating material, only the inner surface of the electrically conductive chamber may be made of insulating material, thus obtaining the same effects as above.

As described above, according to the embodiments, the rotation of electrons under a plurality of appropriate alternating electric fields, a high density plasma is generated in high vacuum. Furthermore, the present invention can have excellent fine processability and high mass productivity, and can considerably reduce the damage to devices such as the destruction of gate oxide films, realizing such a plasma process.

Although the present invention has been fully described in connection with the preferred embodiments thereof with reference to the accompanying drawings, it is to be noted that various changes and modifications are apparent to those skilled in the art. Such changes and modifications are to be understood as being included within the scope of the present invention as defined by the appended claims unless they depart therefrom.

What is claimed is:

1. A method for generating plasma by applying to more than two electrodes, arranged on an insulated surface of a vacuum chamber, high frequencies having different phases in order of positions of the electrodes, comprising rotating electrons in a portion of the vacuum chamber where a plasma is generated when the high frequencies are applied to the electrodes to generate the plasma.

2. The method as claimed in claim 1, wherein the electrodes are rotated by producing a magnetic field which causes rotation of the electrons.

3. A plasma generating apparatus comprising:
a vacuum chamber having an insulated inner surface;
more than two electrodes arranged on the insulated inner surface of the vacuum chamber;
a high frequency applying device for applying high frequencies having different phases in order of positions of the electrodes; and
a holder on which an object to be processed is placed;
wherein electrons, in a portion of the vacuum chamber where a plasma is generated, are rotated when the high frequencies are applied to the electrodes to generate the plasma and a specified process is carried out onto the object by reaction products generated at the portion.

4. The apparatus as claimed in claim 3, further comprising a device for applying an electrical bias to the holder.

5. The apparatus as claimed in claim 3, wherein a surface of the holder where the object is placed is substantially the same as the electrodes.

6. The apparatus as claimed in claim 3, further comprising a device for generating a potential between the holder and the portion of the vacuum chamber.

* * * * *